(12) United States Patent
Wang et al.

(10) Patent No.: US 12,187,597 B2
(45) Date of Patent: Jan. 7, 2025

(54) MEMS MICROPHONE

(71) Applicant: AAC Kaitai Technologies (Wuhan) CO., LTD, Hubei (CN)

(72) Inventors: Kaijie Wang, Shenzhen (CN); Zhuanzhuan Zhao, Shenzhen (CN)

(73) Assignee: AAC Kaitai Technologies (Wuhan) CO., LTD, Wuhan (CN)

( * ) Notice: Subject to any disclaimer, the term of this patent is extended or adjusted under 35 U.S.C. 154(b) by 437 days.

(21) Appl. No.: 17/833,918

(22) Filed: Jun. 7, 2022

(65) Prior Publication Data

US 2023/0192473 A1 Jun. 22, 2023

(30) Foreign Application Priority Data

Dec. 22, 2021 (CN) .......................... 202123254492.1

(51) Int. Cl.
 *B81B 3/00* (2006.01)
 *B81B 7/02* (2006.01)
 *H04R 19/00* (2006.01)
 *H04R 19/04* (2006.01)

(52) U.S. Cl.
 CPC .............. *B81B 3/0021* (2013.01); *B81B 7/02* (2013.01); *H04R 19/005* (2013.01); *H04R 19/04* (2013.01); *B81B 2201/0257* (2013.01); *B81B 2203/0118* (2013.01); *B81B 2203/0127* (2013.01); *B81B 2203/04* (2013.01); *H04R 2201/003* (2013.01)

(58) Field of Classification Search
 None
 See application file for complete search history.

(56) References Cited

U.S. PATENT DOCUMENTS

2021/0345939 A1* 11/2021 Jumbe .................... H04R 1/028

* cited by examiner

*Primary Examiner* — Anthony Ho
(74) *Attorney, Agent, or Firm* — W&G Law Group (57) ABSTRACT

A MEMS microphone includes a substrate, a base, a capacitance system, and at least one cantilever structure. The substrate includes a back cavity, the base is disposed on one side of the substrate, and the capacitance system is disposed on the base. The capacitance system includes at least one back plate assembly, at least one first vibration diaphragm, and at least one second vibration diaphragm. The at least one first vibration diaphragm includes a first sub-vibration diaphragm, and the at least one second vibration diaphragm includes a second sub-vibration diaphragm. The sub-vibration diaphragm and the second sub-vibration diaphragm form a cantilever beam structure on the base, which increase compliance of the at least one first vibration diaphragm and the at least one second vibration diaphragm and reduce tension of the at least one first vibration diaphragm and the at least one second vibration diaphragm, thereby improving sensitivity of the microphones.

10 Claims, 5 Drawing Sheets

MEMS MICROPHONE

TECHNICAL FIELD

The present disclosure relates to the field of electroacoustic conversion, and in particular to a MEMS microphone.

BACKGROUND

Recently, as Micro-Electro-Mechanical System (MEMS) has characteristics of miniaturization, easy integration, high performance, low cost, etc., the MEMS is favored in an industry, and MEMS microphones are widely used in current mobile phones.

Common MEMS microphones are in a capacitance type, each of which mainly includes a vibration diaphragm and a back plate, the vibration diaphragm and the back plate constitute a MEMS acoustic sensing capacitor, and the MEMS acoustic sensing capacitor is further connected to a processing chip through a connecting disk to output an acoustic sensing signal to the processing chip for signal processing. In order to further improve performance of the MEMS microphones, the related art proposes a structure of a MEMS microphone having double vibration diaphragms, which forms capacitor structures using the double vibration diaphragms respectively with a back plate. However, due to a fact that the vibration diaphragms have disadvantages of large tension and insufficient compliance, sensitivity of the microphones is reduced.

SUMMARY

The present disclosure aims to provide a MEMS microphone to solve problems in the related art that vibration diaphragms have disadvantages of large tension and insufficient compliance, thereby reducing sensitivity of microphones.

The present disclosure provides a MEMS microphone, including a substrate, a base, a capacitance system, and at least one cantilever structure. The substrate includes a back cavity, the base is disposed on one side of the substrate, and the capacitance system is disposed on the base. The capacitance system includes at least one back plate assembly, at least one first vibration diaphragm, and at least one second vibration diaphragm. The at least one first vibration diaphragm and the at least one second vibration diaphragm are opposite to the at least one back plate assembly and are respectively disposed on both sides of the at least one back plate assembly at intervals. The at least one cantilever structure includes an assembly space, a first side of the at least one cantilever structure is fixedly connected to an inner side of the base, a second side of the at least one cantilever structure is not fixed, and the second side of the at least one cantilever structure is spaced from the inner side of the base. The at least one back plate assembly includes a sub-back plate assembly, the sub-back plate assembly is connected to the at least one cantilever structure and is disposed in the assembly space. The at least one first vibration diaphragm includes a first sub-vibration diaphragm, the first sub-vibration diaphragm is connected to the at least one cantilever structure and is disposed in the assembly space. And the at least one second vibration diaphragm includes a second sub-vibration diaphragm, the second sub-vibration diaphragm is connected to the at least one cantilever structure and is disposed in the assembly space.

As an improvement, the at least one cantilever structure includes a cross beam assembly, both sides of the cross beam assembly are fixedly connected to the inner side of the base. The cross beam assembly and the base enclose to form the assembly space, and one side, facing away from the assembly space, of the cross beam assembly is spaced from the inner side of the base.

As an improvement, the MEMS microphone includes one cantilever structure, the cross beam assembly includes at least two cross beams, the at least two cross beams are connected in sequence. A head end of each of the at least two cross beams and a tail end of each of the at least two cross beams are fixedly connected to the inner side of the base. Each of the at least two cross beams extends along an inner contour of the base, and each of the at least two cross beams is spaced from the inner side of the base.

As an improvement, the MEMS microphone includes two or more cantilever structures, further including two or more cross beam assemblies. Each of the two or more cantilever structures includes one back plate assembly, one first vibration diaphragm, and one second vibration diaphragm. The two or more cross beam assemblies are disposed around a center of the base at intervals in an equal angle, and slits are formed between adjacent two of the two or more cross beam assemblies.

As an improvement, each of the two or more cross beam assemblies includes at least two cross beams, the at least two cross beams are connected in sequence. A head end of each of the at least two cross beams and a tail end of each of the at least two cross beams are fixedly connected to the inner side of the base. A first side, corresponding to the two or more cross beam assemblies, of the capacitance system is fixed to the inner side of the base, the at least two cross beams of each of the two or more cross beam assemblies surround a second side of the capacitance system, where the second side of the capacitance system is not connected to the base, and the slits are formed between the at least two cross beams of the adjacent two of the two or more cantilever structures.

As an improvement, the at least one cantilever structure further includes reinforcing ribs, the reinforcing ribs are correspondingly fixed to corresponding sides, facing away from the assembly space, of the cross beams, and the reinforcing ribs are matched with the cross beams.

As an improvement, the first sub-vibration diaphragm and the second sub-vibration diaphragm are all fixedly connected to the inner side of the base. The first sub-vibration diaphragm, the second sub-vibration diaphragm, the base, and the at least one cantilever structure enclose to form a sealing space.

As an improvement, the MEMS microphone further includes at least one supporting insulating member, the at least one supporting insulating member is matched with the at least one cantilever structure, and two ends of the at least one supporting insulating member are respectively fixedly connected to the first sub-vibration diaphragm and the second sub-vibration diaphragm. The at least one supporting insulating member penetrates through the least one back plate assembly.

As an improvement, the MEMS microphone further includes a plurality of supporting insulating members, the plurality of the supporting insulating members are disposed around the center of the base at intervals.

As an improvement, the sub-back plate assembly includes a back plate, a first electrode layer, and a second electrode layer. The back plate, the first electrode layer, and the second electrode layer are fixedly connected to the at least one cantilever structure and the inner side of the base. The first electrode layer is stacked on a first plate surface, close to the first sub-vibration diaphragm, of the back plate. The second electrode layer is stacked on a second plate surface, close to the second sub-vibration diaphragm, of the back plate. The first electrode layer is spaced from the first sub-vibration diaphragm, and the second electrode layer is spaced from the second-vibration diaphragm.

Beneficial effects of the present disclosure are as following.

The present disclosure provides the MEMS microphone, including the at least one cantilever structure, the first side of the at least one cantilever structure is fixedly connected to the inner side of the base, the second side of the at least one cantilever structure is not fixed, and the second side of the at least one cantilever structure is spaced from the inner side of the base, so that the at least one cantilever structure forms a cantilever beam structure on the base and vibrates. Further, the first sub-vibration diaphragm and the second sub-vibration diaphragm are fixed in the assembly space of the at least one cantilever structure, so that the first sub-vibration diaphragm and the second sub-vibration diaphragm vibrate along with the at least one cantilever structure, that is, the first sub-vibration diaphragm and the second sub-vibration diaphragm also form a cantilever beam structure on the base, which increase compliance of the at least one first vibration diaphragm and the at least one second vibration diaphragm and reduce tension of the at least one first vibration diaphragm and the at least one second vibration diaphragm, thereby improving sensitivity of the microphones.

DETAILED DESCRIPTION OF EMBODIMENTS

The present disclosure is further described below with reference to the accompanying drawings and embodiments.

Figure 1:
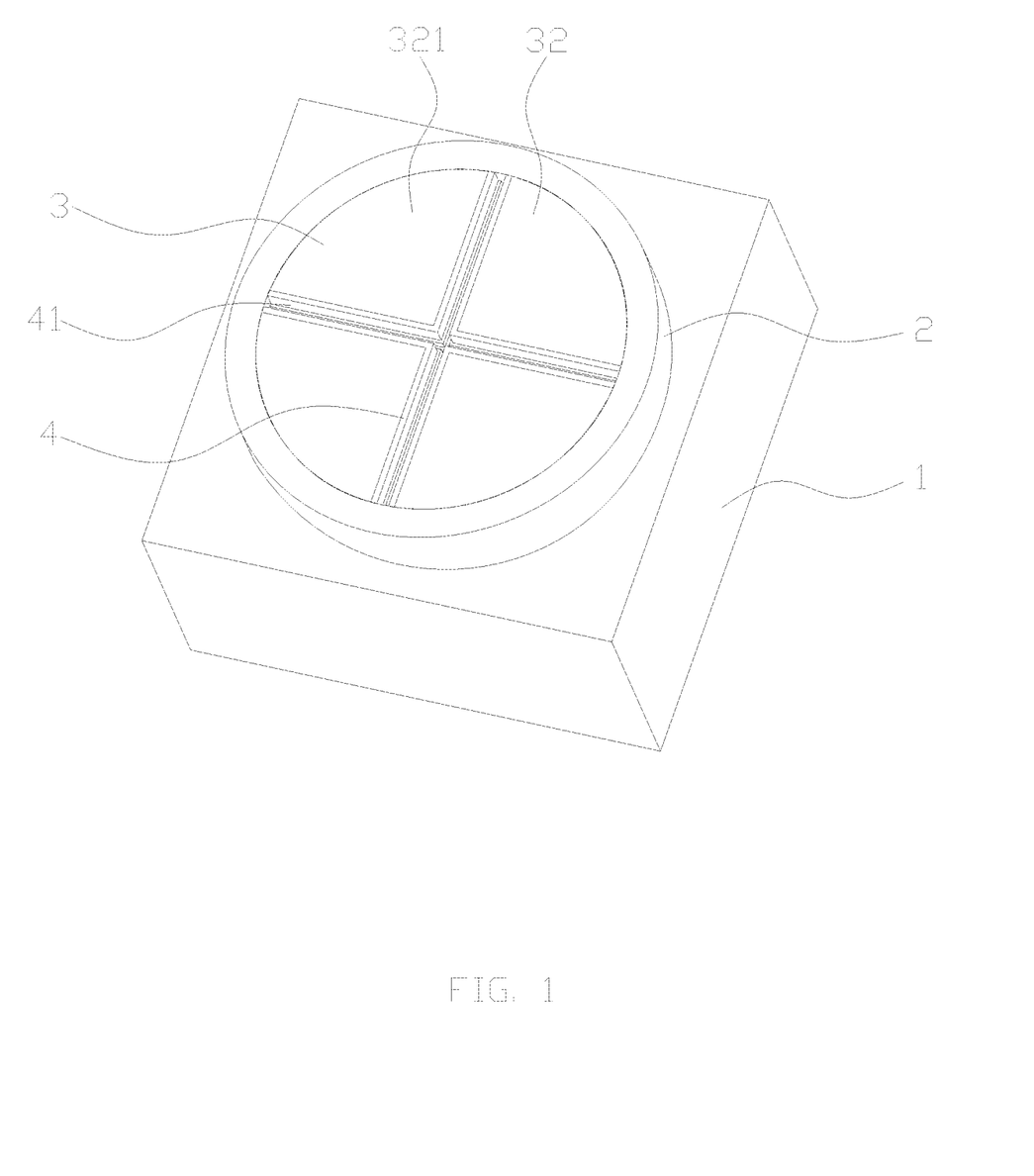
FIG. 1 is an overall structural schematic diagram of a MEMS microphone of the present disclosure.
Figure 2:
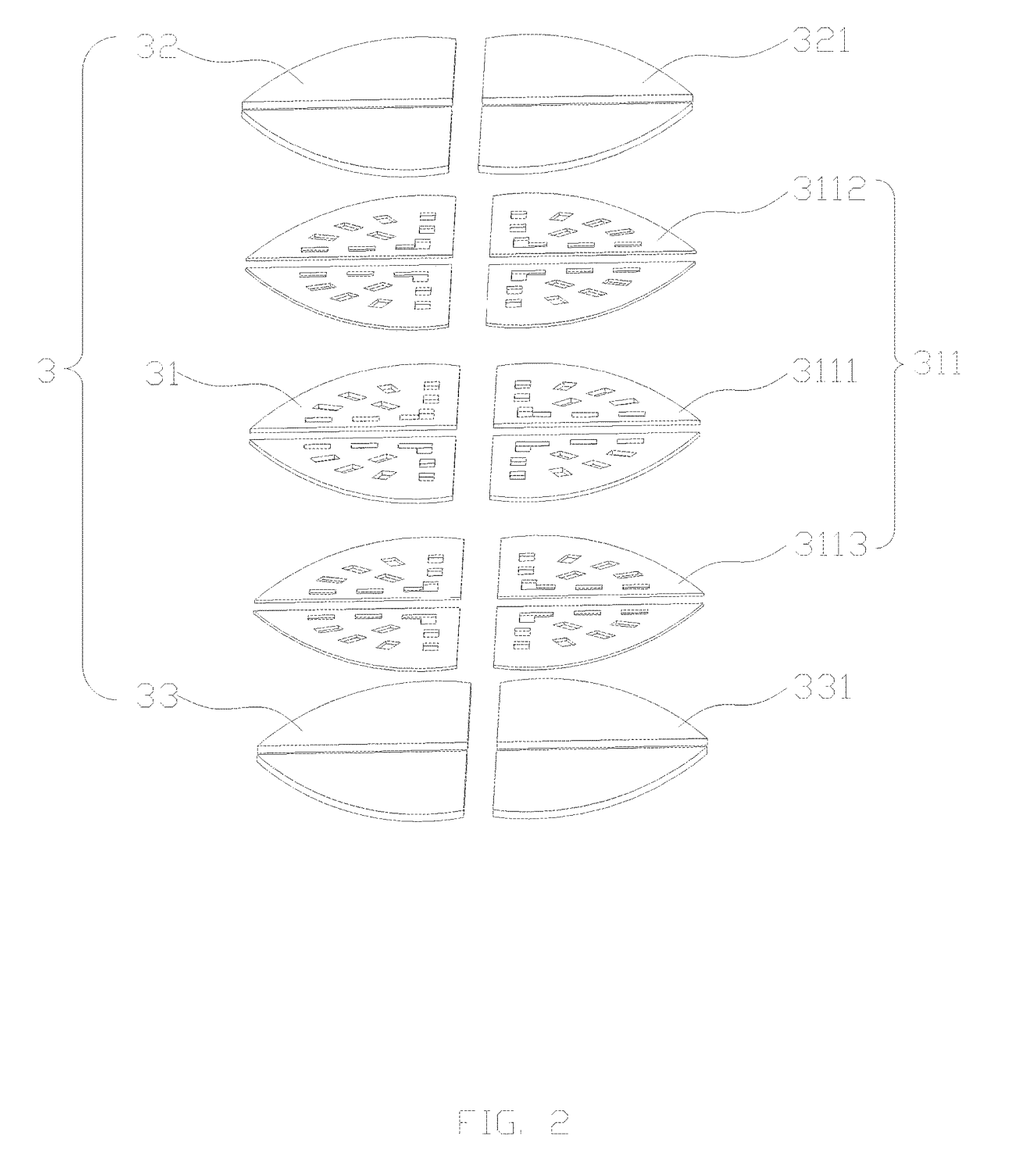
FIG. 2 is an exploded structural schematic diagram of a capacitance system of the MEMS microphone of the present disclosure.
Figure 3:
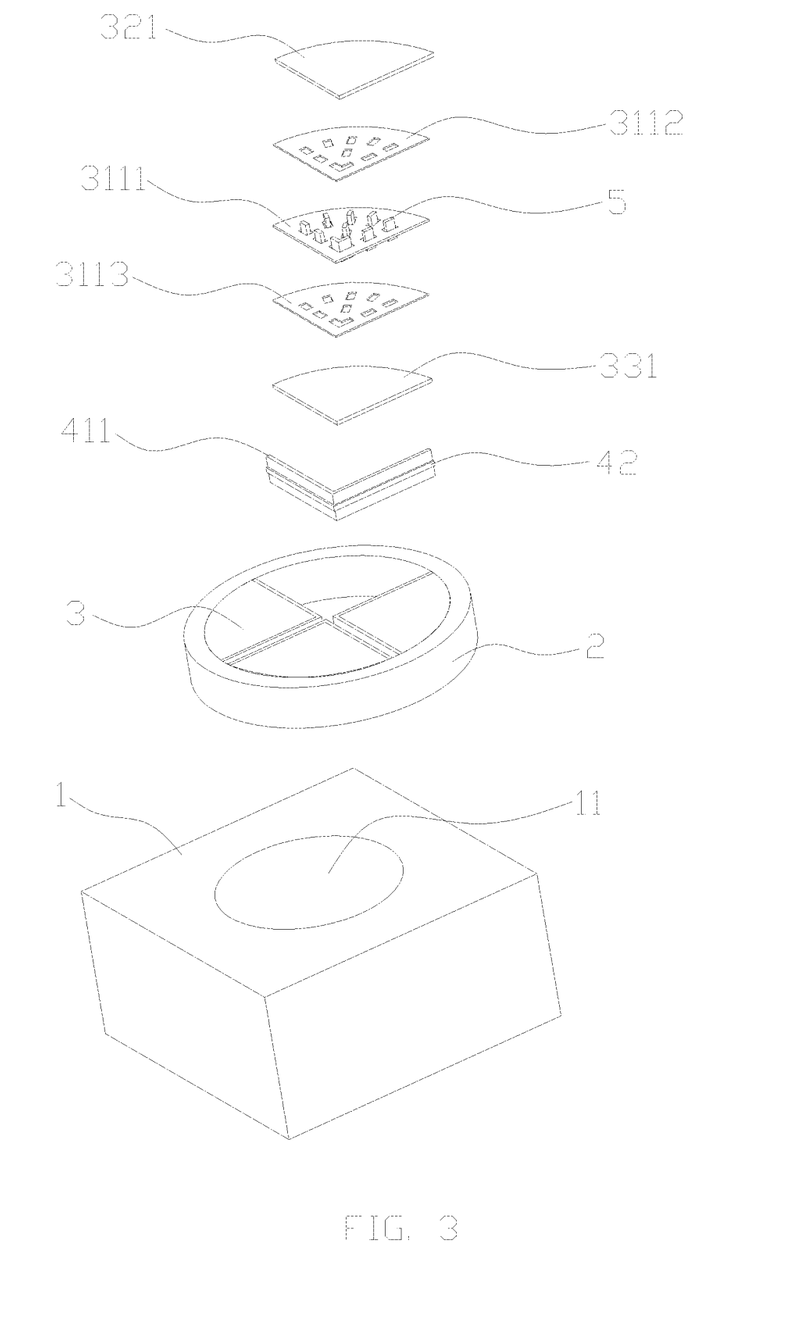
FIG. 3 is an exploded structural schematic diagram of partial assemblies of the MEMS microphone of the present disclosure.

As shown in FIGS. 1-3, the present disclosure provides a MEMS microphone, including a substrate 1, a base 2, a capacitance system 3, and at least one cantilever structure 4. The substrate 1 includes a back cavity 11, the base 2 is disposed on one side of the substrate 1, and the capacitance system 3 is disposed on the base 2. The capacitance system 3 includes at least one back plate assembly 31, at least one first vibration diaphragm 32, and at least one second vibration diaphragm 33. The at least one first vibration diaphragm 32 and the at least one second vibration diaphragm 33 are opposite to the at least one back plate assembly 31 and are respectively disposed on both sides of the at least one back plate assembly 31 at intervals. The at least one cantilever structure 4 includes an assembly space, a first side of the at least one cantilever structure 4 is fixedly connected to an inner side of the base 2, a second side of the at least one cantilever structure 4 is not fixed, and the second side of the at least one cantilever structure 4 is spaced from the inner side of the base 2. The at least one back plate assembly 31 includes a sub-back plate assembly 311, the sub-back plate assembly 311 is connected to the at least one cantilever structure 4 and is disposed in the assembly space. The at least one first vibration diaphragm 32 includes a first sub-vibration diaphragm 321, the first sub-vibration diaphragm 321 is connected to the at least one cantilever structure 4 and is disposed in the assembly space. And the at least one second vibration diaphragm 33 includes a second sub-vibration diaphragm 331, the second sub-vibration diaphragm 331 is connected to the at least one cantilever structure 4 and is disposed in the assembly space. It should be understood that the first side of the at least one cantilever structure 4 is fixedly connected to the inner side of the base 2, the second side of the at least one cantilever structure 4 is not fixed, and the second side of the at least one cantilever structure 4 is spaced from the inner side of the base 2, so that the at least one cantilever structure 4 forms a cantilever beam structure on the base and vibrates. Further, the first sub-vibration diaphragm 321 and the second sub-vibration diaphragm 331 are fixed in the assembly space of the at least one cantilever structure 4, so that the first sub-vibration diaphragm 321 and the second sub-vibration diaphragm 331 vibrate along with the at least one cantilever structure 4, that is, the first sub-vibration diaphragm 321 and the second sub-vibration diaphragm 331 also form a cantilever beam structure on the base 2, which increase compliance of the at least one first vibration diaphragm 32 and the at least one second vibration diaphragm 33 and reduce tension of the at least one first vibration diaphragm 32 and the at least one second vibration diaphragm 33, thereby improving sensitivity of the microphones.

Figure 4:
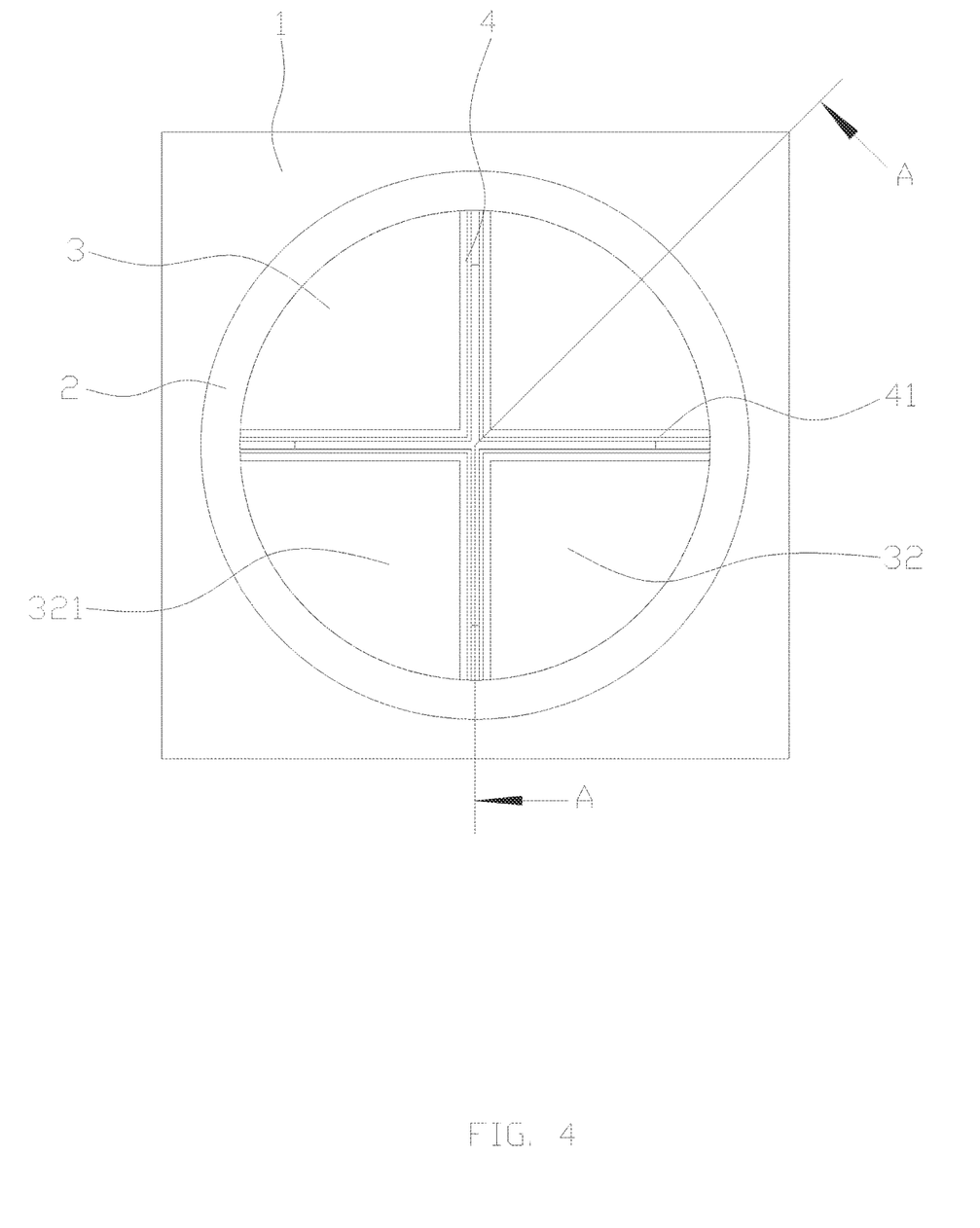
FIG. 4 is a top schematic diagram of the MEMS microphone of the present disclosure.
Figure 5:
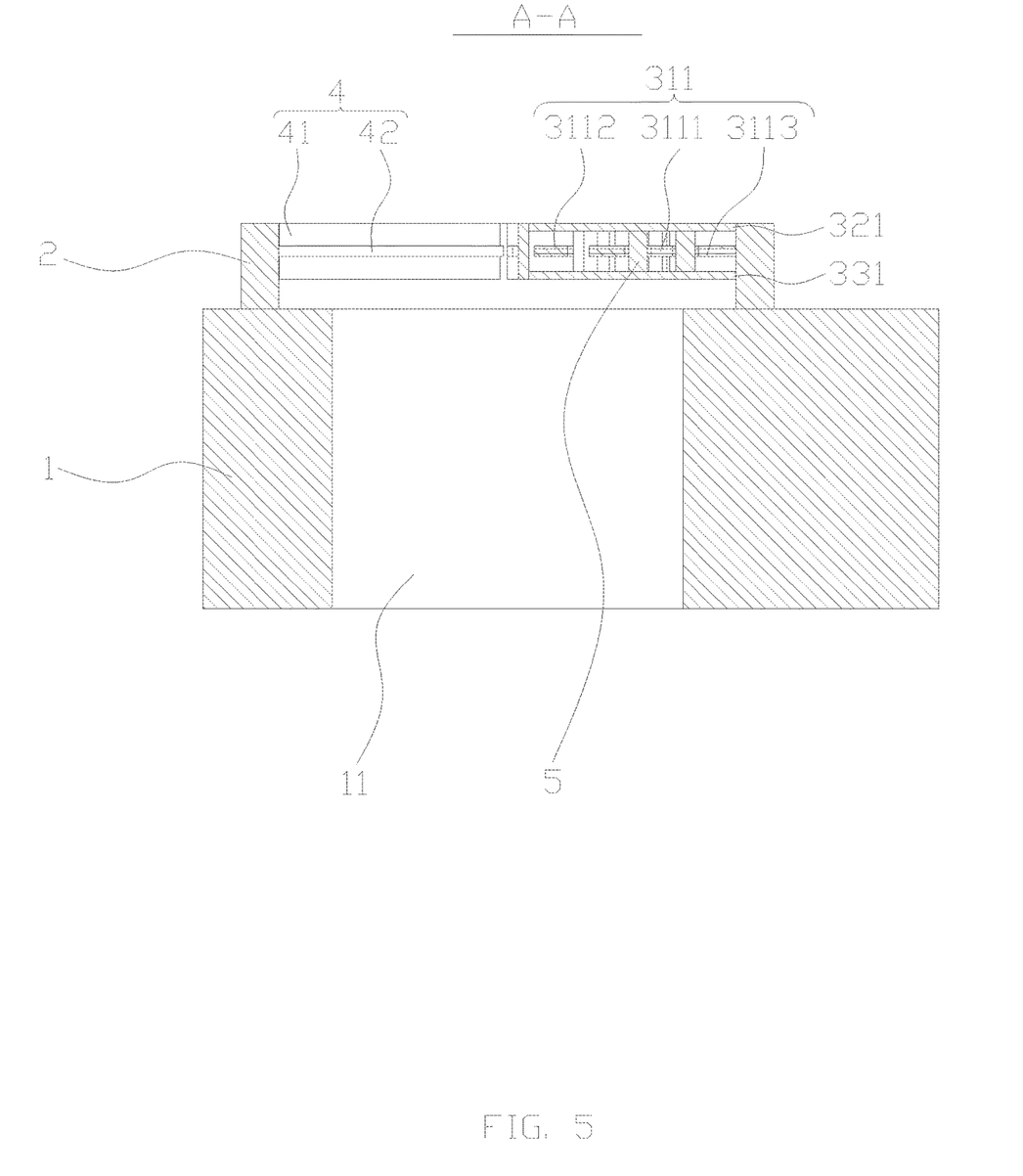
FIG. 5 is a cross-sectional schematic diagram taken along the line A-A shown in FIG. 4.

As shown in FIGS. 3-5, in the embodiment, the at least one cantilever structure 4 includes a cross beam assembly 41, both sides of the cross beam assembly 41 are fixedly connected to the inner side of the base 2. The cross beam assembly 41 and the base 2 enclose to form the assembly space, and one side, facing away from the assembly space, of the cross beam assembly 41 is spaced from the inner side of the base 2. Specifically, the base 1 may be a rectangular block, the back cavity 11 may be a cylindrical hole, and a center line of the back cavity 11 coincides with a center line of the substrate 1. The base 2 may be a circular ring or a rectangular ring, a diameter of an inner hole of the base 2 is greater than a diameter of the back cavity 11, so that the base 2 may enclose outside the back cavity 11. The substrate 1 and the base 2 may be made of a semiconductor material, such as silicon, and the back cavity 11 may be formed through a bulk silicon process or a dry etching. The assembly space enclosed through the cross beam assembly 41 and the base 2 may be rectangular or fan-shaped or others, both sides of the cross beam assembly 41 are fixedly connected to the inner side of the base 2, and the one side, facing away from the assembly space, of the cross beam assembly 41 is spaced from the inner side of the base 2, so that the cross beam assembly 41 forms the cantilever beam structure on the base to smoothly vibrate the cross beam assembly 41 on the base 2, thereby ensuring that the cross beam assembly 41 drives the capacitance system 3 to smoothly vibrate on the base 2, further increasing compliance of the capacitance system 3, and reducing tension of the capacitance system 3, so as to improve the sensitivity of the microphones.

In the embodiment, the MEMS microphone may include any number of the cantilever structure 4, such as one, two, four, six, or eight, etc.

As shown in FIGS. 3-5, in one embodiment, the MEMS microphone includes one cantilever structure 4, the cross beam assembly 41 includes at least two cross beams 411, the at least two cross beams 411 are connected in sequence. A head end of each of the at least two cross beams 411 and a tail end of each of the at least two cross beams 411 are fixedly connected to the inner side of the base 2. Each of the at least two cross beams 411 extends along an inner contour of the base 2, and each of the at least two cross beams 411 is spaced from the inner side of the base 2. As an improvement, the base 2 is a rectangular ring, the cross beam assembly 41 includes three cross beams 411, the three cross beams 411 are connected in sequence to form a rectangular cavity having an opening, and the head and tail ends of each of the three cross beams 411 are fixedly connected to the inner side of the base 2, so that the three cross beams 411 and the base 2 enclose to form the assembly space. The three cross beams 411 are spaced from corresponding inner side of the base 2, and the head and tail ends of each of the three cross beams 411 are fixedly connected to the corresponding inner side of the base 2, so that the cross beam assembly 41 forms the cantilever beam structure on the base 2. It should be understood that the MEMS microphone merely includes one cantilever structure 4 in the one embodiment, so that there is merely one vibration area disposed in the MEMS microphone, which is beneficial for ensuring vibration consistency of each component in the capacitance system 3, thereby increasing compliance of the at least one first vibration diaphragm 32 and the at least one second vibration diaphragm 33 and improving the sensitivity of the microphones. In addition, a number of the cross beam assembly 41 may also be set as required, such as two, four, and five, etc.

As shown in FIGS. 3-4, in one embodiment, the MEMS microphone includes two or more cantilever structures 4, further comprising two or more cross beam assemblies 41. Each of the two or more cantilever structures 4 includes one back plate assembly 311, one first vibration diaphragm 321, and one second vibration diaphragm 331. The two or more cross beam assemblies 41 are disposed around a center of the base 2 at intervals in an equal angle, and slits are formed between adjacent two of the two or more cross beam assemblies 41. As an improvement, the MEMS microphone includes four cantilever structures 4, further including four cross beam assemblies 41, the four cross beam assemblies 41 are disposed around the center of the base 2 at intervals in an equal angle, and the slits formed between the adjacent two of the four cross beam assemblies 41 show a cross shape. In the embodiment, each of the two or more cross beam assemblies 41 includes at least two cross beams 411, the at least two cross beams 411 are connected in sequence. A head end of each of the at least two cross beams 411 and a tail end of each of the at least two cross beams 411 are fixedly connected to the inner side of the base 2. A first side, corresponding to the two or more cross beam assemblies 41, of the capacitance system 3 is fixed to the inner side of the base 2, the at least two cross beams 411 of each of the two or more cross beam assemblies 41 surround a second side of the capacitance system 3, where the second side of the capacitance system 3 is not connected to the base 2, and the slits are formed between the at least two cross beams 411 of the adjacent two of the two or more cantilever structures 4. As an improvement, each of the two or more cross beam assemblies 41 includes two cross beams 411, the two cross beams 411 are connected in sequence to form a V shape, the base 2 is a circular ring, and at this time, the assembly space enclosed through each of the two or more cross beam assemblies 41 and the base 2 is fan-shaped. It should be understood that each of the two or more cantilever structures 4 forms a corresponding cantilever beam structure on the base 2 to increase compliance of the first sub-vibration diaphragm 321 and the second sub-vibration diaphragm 331. Compared with the MEMS microphone having merely one cantilever structure, the MEMS microphone having four cantilever structures divide the one vibration area into four vibration areas, thereby reducing an area of the vibration diaphragms in the vibration areas under a condition that an area of the vibration areas is not changed to reduce the tension of the at least one first vibration diaphragm 32 and the at least one second vibration diaphragm 33. Moreover, the four cantilever structures 4 are easier to vibrate, so that the compliance of the at least one first vibration diaphragm 32 and the at least one second vibration diaphragm 33 is increased, thereby improving the sensitivity of the microphones.

As shown in FIGS. 3-5, in the embodiment, the at least one cantilever structure 4 further includes reinforcing ribs 42, the reinforcing ribs 42 are correspondingly fixed to corresponding sides, facing away from the assembly space, of the cross beams 411, and the reinforcing ribs 42 are matched with the cross beams 411. Specifically, the reinforcing ribs 42 may be rectangular strips and the reinforcing ribs 42 are made of an insulating material. The reinforcing ribs 42 are disposed in a middle area of each of the cross beams 411 of the cross beam assembly 41, which improve rigidity of the cross beam assembly 41, so that sufficient supporting force may be provided for the capacitance system 3 through the cross beam assembly 41. As an improvement, a material of the cross beam assembly 41 and a material of the reinforcing ribs 42 may be undoped polysilicon, silicon nitride, and other one or more insulating layers.

As shown in FIGS. 3-5, in the embodiment, the first sub-vibration diaphragm 321 and the second sub-vibration diaphragm 331 are all fixedly connected to the inner side of the base 2. The first sub-vibration diaphragm 321, the second sub-vibration diaphragm 331, the base 2, and the at least one cantilever structure 4 enclose to form a sealing space. Specifically, the sub-back plate assembly 311 is disposed in the middle area of the at least one cantilever structure 4, the first sub-vibration diaphragm 321 is flush with a side, distal from the substrate 1, of the base 2, the second sub-vibration diaphragm 331 is disposed on one side, close to the substrate 1, of the sub-back plate assembly 311, the first sub-vibration diaphragm 321 is spaced from the sub-back plate assembly 311 to form a first gap, the second sub-vibration diaphragm 331 is spaced from the sub-back plate assembly 311 to form a second gap, and the first gap is equal to the second gap. The first sub-vibration diaphragm 321, the second sub-vibration diaphragm 331, and the sub-back plate assembly 311 are all matched to the assembly space of the at least one cantilever structure 4, that is, the first sub-vibration diaphragm 321, the second sub-vibration diaphragm 331, and the sub-back plate assembly 311 are all fixedly connected to the cross beam 411 of the cross beam assembly 41 and the inner side of the base 2, so that a floating portion of the first sub-vibration diaphragm 321, a floating portion of the second sub-vibration diaphragm 331, and a floating portion of the sub-back plate assembly 311 are not in contact. Further, the sealing space is formed between the first sub-vibration diaphragm 321 and the second sub-vibration diaphragm 331, and the sealing space is a low-vacuum area, so that noise between the vibration diaphragms and the sub-back plate assembly 311 is reduced, thereby improving the sensitivity of the microphones. After the microphones are powered on, the first sub-vibration diaphragm 321 and the sub-back plate assembly 311, the second sub-vibration diaphragm 331 and the sub-back plate assembly 311 are charged with opposite polarities, thereby forming capacitance. It can be understood that when the first sub-vibration diaphragm 321 and the second sub-vibration diaphragm 331 are driven to vibrate though sound waves, the first gap between the sub-back plate assembly 311 and the first sub-vibration diaphragm 321, and the second gap between the sub-back plate assembly 311 and the second sub-vibration diaphragm 331 may be changed, which changes capacitance of the capacitance system 3, thereby converting an acoustic signal into an electrical signal to achieve a corresponding function of the microphones.

As shown in FIGS. 3-5, in the embodiment, the MEMS microphone further includes at least one supporting insulating member 5, the at least one supporting insulating member 5 is matched with the at least one cantilever structure 4, and two ends of the at least one supporting insulating member 5 are respectively fixedly connected to the first sub-vibration diaphragm 321 and the second sub-vibration diaphragm 331. The at least one supporting insulating member 5 penetrates through the least one back plate assembly 31. Specifically, the MEMS microphone further includes a plurality of supporting insulating members 5, the plurality of the supporting insulating members 5 are disposed between the first sub-vibration diaphragm 321 and the second sub-vibration diaphragm 331, after the microphones are powered on, the plurality of the supporting insulating members 5 divide the first sub-vibration diaphragm 321 and the second sub-vibration diaphragm 331 into a plurality of vibration units. For ease of description, one supporting insulating member 5 is provided between the first sub-vibration diaphragm 321 and the second sub-vibration diaphragm 331 as an example, at this time, the supporting insulating member 5 divides the first sub-vibration diaphragm 321 into two vibration units, and the second sub-vibration diaphragm 331 is further divided into two vibration units, and at this time, any one of the vibration units forms capacitance with the back plate assembly 31, that is, the two vibration diaphragms and one back plate assembly 31 jointly form four capacitance, so that the sensitivity and a signal-to-noise ratio of the microphones are improved. Moreover, since the supporting insulating member 5 penetrates through the back plate assembly 31, the supporting insulating member 5 does not break away from the back plate assembly 31, the supporting insulating member 5 may provide supporting force for the first sub-vibration diaphragm 321 and the second sub-vibration diaphragm 331, and when the first sub-vibration diaphragm 321 and the second sub-vibration diaphragm 331 bear high sound pressure, the supporting insulating member 5 may limit vibration amplitude of the first sub-vibration diaphragm 321 and the second sub-vibration diaphragm 331, thereby preventing the first sub-vibration diaphragm 321 and the second sub-vibration diaphragm 331 from being damaged.

As shown in FIGS. 3-5, in the embodiment, the MEMS microphone further includes a plurality of the supporting insulating members 5, the plurality of the supporting insulating members 5 are disposed around the center of the base 2 at intervals. Specifically, the plurality of the supporting insulating members 5 are disposed in a circular ring by taking the center of the base 2 as a circle center, and a number of the supporting insulating members 5 in a circular ring that is closer to the circle center is less than a number of the supporting insulating member 5 in the circular ring that is far from the circle center. For ease of understanding, as an example, the MEMS microphone includes four cantilever structures 4, each of the four cantilever structures 4 is provided with ten supporting insulating members 5, and the ten supporting insulating members 5 are disposed as circular rings by taking the center of the base 2 as the circle center, there are totally three circular rings disposed, and intervals between the three circular rings are equal. The three circular rings include a first circular ring, a second circular ring, and a third circular ring. The first circular ring which is closest to the circle center is provided with two supporting insulating members 5, the second circular ring which is disposed in middle is provided with three supporting insulating members 5, and the third circular ring which is farthest from the circle center is provided with five supporting insulating members 5. At this time, a number of the supporting insulating members 5 disposed at a movable end of each of the four cantilever structures 4 is the least, which is beneficial for vibrating the first sub-vibration diaphragm 321 and the second sub-vibration diaphragm 331 located in an area where the movable end of each of the four cantilever structures 4 locates, a number of the supporting insulating members 5 disposed at a fixed end of each of the four cantilever structures 4 is at most, which is beneficial for stably keeping the first sub-vibration diaphragm 321 and the second sub-vibration diaphragm 331 located in an area where the fixed end of each of the four cantilever structures 4 locates, so that the cantilever beam structure formed by the first sub-vibration diaphragm 321 and the second sub-vibration diaphragm 331 on the base 2 is more stable.

As shown in FIGS. 2-5, in the embodiment, the sub-back plate assembly 311 includes a back plate 3111, a first electrode layer 3112, and a second electrode layer 3113. The back plate 3111, the first electrode layer 3112, and the second electrode layer 3113 are fixedly connected to the at least one cantilever structure 4 and the inner side of the base 2. The first electrode layer 3112 is stacked on a first plate surface, close to the first sub-vibration diaphragm 321, of the back plate 3111. The second electrode layer 3113 is stacked on a second plate surface, close to the second sub-vibration diaphragm 331, of the back plate 3111. The first electrode layer 3111 is spaced from the first sub-vibration diaphragm 321, and the second electrode layer 3113 is spaced from the second-vibration diaphragm 331. A material of the back plate 3111 is an insulating material, which ensures that the first electrode layer 3112 and the second electrode layer 3113 are insulated from each other, and after the microphones are powered on, the first sub-vibration diaphragm 321 and the first electrode layer 3112, the second sub-vibration diaphragm 331 and the second electrode layer 3113 have opposite charges to form capacitance.

The foregoing are merely embodiments of the present disclosure, and it should be noted that, for those who skilled in the art, improvements can be made without departing from the concepts of the present disclosure, but these are all within the protection scopes of the present disclosure.

What is claimed is:

1. A Micro-Electro-Mechanical System (MEMS) microphone, comprising:
a substrate;
a base;
a capacitance system; and
at least one cantilever structure;
wherein the substrate comprises a back cavity, the base is disposed on one side of the substrate, and the capacitance system is disposed on the base; the capacitance system comprises at least one back plate assembly, at least one first vibration diaphragm, and at least one second vibration diaphragm; the at least one first vibration diaphragm and the at least one second vibration diaphragm are opposite to the at least one back plate assembly and are respectively disposed on both sides of the at least one back plate assembly at intervals; the at least one cantilever structure comprises an assembly space, a first side of the at least one cantilever structure is fixedly connected to an inner side of the base, a second side of the at least one cantilever structure is not fixed, and the second side of the at least one cantilever structure is spaced from the inner side of the base; the at least one back plate assembly comprises a sub-back plate assembly, the sub-back plate assembly is connected to the at least one cantilever structure and is disposed in the assembly space; the at least one first vibration diaphragm comprises a first sub-vibration diaphragm, the first sub-vibration diaphragm is connected to the at least one cantilever structure and is disposed in the assembly space; and the at least one second vibration diaphragm comprises a second sub-vibration diaphragm, the second sub-vibration diaphragm is connected to the at least one cantilever structure and is disposed in the assembly space.

2. The MEMS microphone according to claim 1, wherein the at least one cantilever structure comprises a cross beam assembly, both sides of the cross beam assembly are fixedly connected to the inner side of the base; the cross beam assembly and the base enclose to form the assembly space; and one side, facing away from the assembly space, of the cross beam assembly is spaced from the inner side of the base.

3. The MEMS microphone according to claim 2, wherein the MEMS microphone comprises one cantilever structure, the cross beam assembly comprises at least two cross beams, the at least two cross beams are connected in sequence; a head end of each of the at least two cross beams and a tail end of each of the at least two cross beams are fixedly connected to the inner side of the base; each of the at least two cross beams extends along an inner contour of the base, and each of the at least two cross beams is spaced from the inner side of the base.

4. The MEMS microphone according to claim 2, wherein the MEMS microphone comprises two or more cantilever structures, further comprising two or more cross beam assemblies; each of the two or more cantilever structures comprises one back plate assembly, one first vibration diaphragm, and one second vibration diaphragm; the two or more cross beam assemblies are disposed around a center of the base at intervals in an equal angle, and slits are formed between adjacent two of the two or more cross beam assemblies.

5. The MEMS microphone according to claim 4, wherein each of the two or more cross beam assemblies comprises at least two cross beams, the at least two cross beams are connected in sequence; a head end of each of the at least two cross beams and a tail end of each of the at least two cross beams are fixedly connected to the inner side of the base; a first side, corresponding to the two or more cross beam assemblies, of the capacitance system is fixed to the inner side of the base, the at least two cross beams of each of the two or more cross beam assemblies surround a second side of the capacitance system, where the second side of the capacitance system is not connected to the base, and the slits are formed between the at least two cross beams of the adjacent two of the two or more cantilever structures.

6. The MEMS microphone according to claim 2, wherein the at least one cantilever structure further comprises reinforcing ribs, the reinforcing ribs are correspondingly fixed to corresponding sides, facing away from the assembly space, of the cross beams; and the reinforcing ribs are matched with the cross beams.

7. The MEMS microphone according to claim 2, wherein the first sub-vibration diaphragm and the second sub-vibration diaphragm are all fixedly connected to the inner side of the base; the first sub-vibration diaphragm, the second sub-vibration diaphragm, the base, and the at least one cantilever structure enclose to form a sealing space.

8. The MEMS microphone according to 7, wherein the MEMS microphone further comprises at least one supporting insulating member, the at least one supporting insulating member is matched with the at least one cantilever structure, and two ends of the at least one supporting insulating member are respectively fixedly connected to the first sub-vibration diaphragm and the second sub-vibration diaphragm; the at least one supporting insulating member penetrates through the least one back plate assembly.

9. The MEMS microphone according to 8, wherein the MEMS microphone further comprises a plurality of supporting insulating members, the plurality of the supporting insulating members are disposed around the center of the base at intervals.

10. The MEMS microphone according to 1, wherein the sub-back plate assembly comprises a back plate, a first electrode layer, and a second electrode layer; the back plate, the first electrode layer, and the second electrode layer are fixedly connected to the at least one cantilever structure and the inner side of the base; the first electrode layer is stacked on a first plate surface, close to the first sub-vibration diaphragm, of the back plate; the second electrode layer is stacked on a second plate surface, close to the second sub-vibration diaphragm, of the back plate; the first electrode layer is spaced from the first sub-vibration diaphragm, and the second electrode layer is spaced from the second-vibration diaphragm.

\* \* \* \* \*